United States Patent
Walavalkar et al.

(10) Patent No.: US 9,524,900 B2
(45) Date of Patent: Dec. 20, 2016

(54) SILICON-ON-INSULATOR MICROCHANNELS FOR BIOLOGICAL SENSORS

(71) Applicant: CALIFORNIA INSTITUTE OF TECHNOLOGY, Pasadena, CA (US)

(72) Inventors: Sameer Walavalkar, Studio City, CA (US); Mark D. Goldberg, Alta Loma, CA (US); Axel Scherer, Barnard, VT (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 14/186,839

(22) Filed: Feb. 21, 2014

(65) Prior Publication Data

US 2014/0256114 A1 Sep. 11, 2014

Related U.S. Application Data

(60) Provisional application No. 61/774,357, filed on Mar. 7, 2013.

(51) Int. Cl.
*H01L 21/00* (2006.01)
*H01L 21/762* (2006.01)

(52) U.S. Cl.
CPC ....... *H01L 21/76283* (2013.01); *H01L 21/762* (2013.01)

(58) Field of Classification Search
CPC .................. H01L 21/762; H01L 21/76283
See application file for complete search history.

(56) References Cited

U.S. PATENT DOCUMENTS

| | | | |
|---|---|---|---|
| 5,501,893 A * | 3/1996 | Laermer et al. | 428/161 |
| 6,351,039 B1 * | 2/2002 | Jin et al. | 257/759 |
| 7,971,532 B1 * | 7/2011 | Olson et al. | 102/254 |
| 2007/0001045 A1 * | 1/2007 | Aizenberg et al. | 241/236 |
| 2009/0170716 A1 * | 7/2009 | Su et al. | 506/9 |
| 2011/0121412 A1 * | 5/2011 | Quevy et al. | 257/415 |
| 2011/0162962 A1 * | 7/2011 | Mazellier | 204/403.15 |
| 2012/0013020 A1 * | 1/2012 | Guo et al. | 257/774 |
| 2012/0038024 A1 * | 2/2012 | Botula et al. | 257/510 |

OTHER PUBLICATIONS

Michael David Henry "ICP Etching of Silicon for Micro and Nanoscale Devices" (2010) pp. 1-219.

* cited by examiner

*Primary Examiner* — Caleb Henry
*Assistant Examiner* — Alexander Belousov
(74) *Attorney, Agent, or Firm* — Steinfl & Bruno LLP

(57) ABSTRACT

Novel methods to fabricate biological sensors and electronics are disclosed. A silicon-on-insulator wafer can be employed by etching a pattern of holes in the silicon layer, then a pattern of cavities in the insulating layer, and then sealing the top of the cavities. Further, n or p doped regions and metallic regions can be defined in the processed wafer, thereby enabling integration of biological sensing and electronic capabilities in the same wafer.

8 Claims, 2 Drawing Sheets

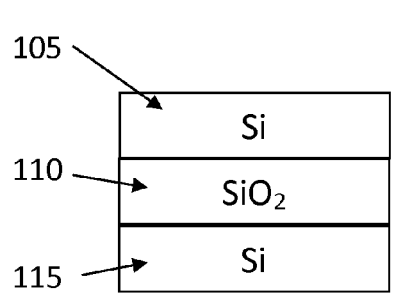
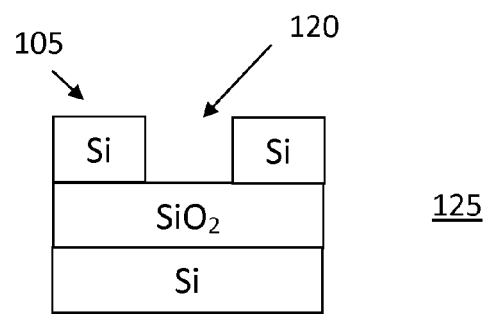
FIG. 1A  FIG. 1B
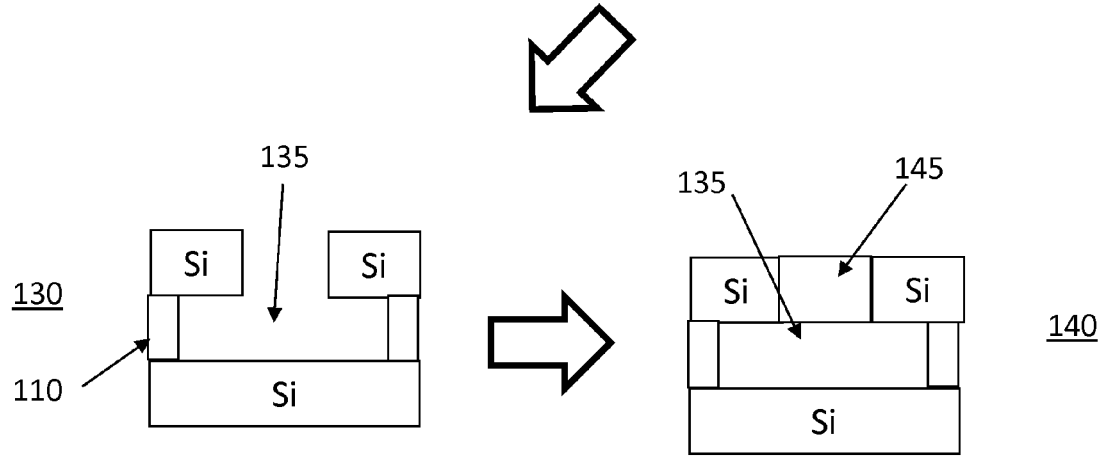
FIG. 1C  FIG. 1D

SILICON-ON-INSULATOR MICROCHANNELS FOR BIOLOGICAL SENSORS

CROSS REFERENCE TO RELATED APPLICATIONS

The present application claims priority to U.S. Provisional Patent Application No. 61/774,357, filed on Mar. 7, 2013, the disclosure of which is incorporated herein by reference in its entirety.

TECHNICAL FIELD

The present disclosure relates to semiconductor structures. More particularly, it relates to silicon-on-insulator channels.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 1A-1D illustrate an overview of one embodiment of a method to fabricate SOI channels.

SUMMARY

Figure 2:
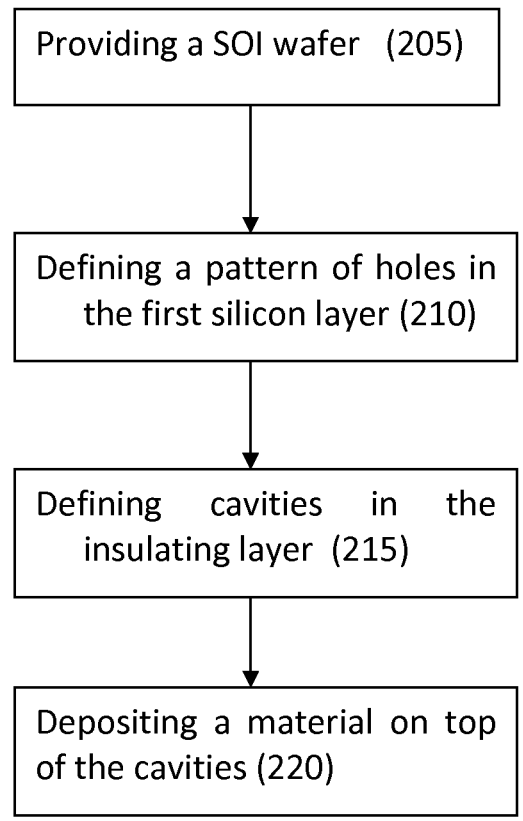
FIG. 2 illustrates a flowchart of an embodiment of the methods of the present disclosure.

In a first aspect of the disclosure, a method is described, the method comprising: providing a silicon-on-insulator wafer, comprising a first silicon layer, an insulating layer, and a second silicon layer; defining a pattern of holes in the first silicon layer, the holes extending perpendicularly to the first silicon layer, thereby reaching through to the insulating layer; defining cavities in the insulating layer at locations corresponding to the holes of the pattern of holes; and depositing a material on top of the cavities or oxidizing the first silicon layer, thereby sealing the top of the cavities while leaving a remaining portion of the cavities intact.

DETAILED DESCRIPTION

In the present disclosure, silicon on insulator (SOI) wafer or chips can be patterned with an array of holes ranging from 1 nm to 1 μm in diameter. The pattern may consist, for example, of photoresist, and may be developed with standard photolithographic techniques. As known to the person skilled in the art, SOI wafers consist of a silicon layer, an insulating layer (such as silicon oxide) and a further silicon layer, with the insulating layer positioned between the two silicon layers. The bottom silicon layer may be a thick substrate.

Once a pattern of holes is defined on the SOI wafer, the holes defined in the patterned mask can be etched using a Bosch or pseudo Bosch etching method, which allows etching of the top layer of silicon on the SOI wafer or chip. Through the etching process, openings that are 1 nm to 1 μm in diameter are obtained, allowing access to the middle, insulating layer of the SOI wafer or chip, for example a silicon oxide layer.

Subsequently, the wafer or chip is treated with hydrogen fluoride (HF) for a time dependent on the thickness of the insulating layer, for example between 0 and 200 minutes. A different acid may also be used, as understood by the person skilled in the art. The wet etching process with HF will generate nano or micro channels or cavities in the oxide layer of the SOI, following the pattern of the array of holes which were previously defined on the SOI wafer. Once the channels or cavities are generated, the holes array on the top layer of SOI are sealed using polymer, metal or oxide growth. For example, a material may be deposited on the top layer to seal the top of the holes, or the material of the top layer may be oxidized. For example, if the material is silicon, by oxidation the holes in the silicon will shrink and seal themselves. Once the sealing is accomplished the SOI wafer can be doped with either p or n type atoms, as with normal semiconductor materials, or metalized in a desired pattern, allowing for electric control of any material placed inside the nano or micro channels or cavities.

In other words, semiconductor doping techniques may be used on the SOI wafer to define regions of n and p character, as well as metalized regions. In this way, a number of semiconductor structures can be realized in the SOI wafer, such as diodes and transistors, as understood by the person skilled in the art.

The process described in the present disclosure provides an innovated step in merging semiconductor materials used in microchip assembly with biology diagnostic devices in a single device. Instead of building the biological sensor and channels or cavities and the electronics separately, with a necessary further step of joining the two devices together, the methods of the present disclosure allow for dual fabrication of the biological and electrical components of any device in the same material. The present disclosure enables, therefore, the fabrication of smaller integrated devices.

FIGS. 1A-1D illustrate one embodiment of the methods of the present disclosure. A SOI wafer comprises a silicon layer (105), an insulating layer (110) and another silicon layer (115). In a first step (125), a pattern of holes (120) is defined on the silicon layer (105). For example, using standard photolithographic techniques, a photoresist mask is defined on the layer (105), and a Bosch or pseudo Bosch process is used to define the holes (120) in layer (105).

In a subsequent step (130), a hole, cavity or channel is defined in the insulating layer (110). For example, HF can be used to etch a silicon oxide layer (110).

In a subsequent step (140), the top of the hole (135) is sealed with a material (145). For example, a polymer, metal or oxide (such as silicon oxide) could be deposited as material (145).

After step (140), standard semiconductor processing techniques may be used to define regions of n and p character, metal regions, or other structures such as diodes and transistors.

FIG. 2 illustrates a flowchart of an embodiment of the methods of the present disclosure.

In a first step (205), silicon-on-insulator wafer is provided, comprising a first silicon layer, an insulating layer, and a second silicon layer.

In a subsequent step (210), a pattern of holes can be defined in the first silicon layer, the holes extending perpendicularly to the first silicon layer, thereby reaching through to the insulating layer.

In a subsequent step (215), cavities can be defined in the insulating layer at locations corresponding to the holes of the pattern of holes.

In a subsequent step (220), a material can be deposited on top of the cavities, thereby sealing the top of the cavities while leaving a remaining portion of the cavity intact.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. A method comprising:
providing a silicon-on-insulator wafer, comprising a first silicon layer, an insulating layer, and a second silicon layer;
defining a pattern of holes in the first silicon layer reaching through to the insulating layer;
defining cavities in the insulating layer at locations corresponding to the holes of the pattern of holes, wherein each cavity respectively has only a single hole; and
depositing a material on top of the cavities or oxidizing the first silicon layer, thereby sealing the top of the cavities and leaving remaining portions of the cavities intact, wherein a top horizontal surface of the material or oxidized first silicon layer is substantially coplanar with a top horizontal surface of the first silicon layer.

2. The method of claim 1, wherein the defining a pattern of holes comprises etching holes in the first silicon layer by a Bosch or pseudo Bosch process.

3. The method of claim 1, wherein the insulating layer is a silicon oxide layer.

4. The method of claim 3, wherein the defining cavities comprises etching the silicon oxide layer with hydrogen fluoride.

5. The method of claim 1, wherein the material is a polymer, a metal, or an oxide.

6. The method of claim 5, further comprising defining n or p doped semiconductor regions and metallic regions in the silicon-on-insulator wafer.

7. The method of claim 6, wherein the n or p doped semiconductor regions and the metallic regions form a biological sensor and associated electronics.

8. The method of claim 1, wherein each cavity of the cavities extends wider than its corresponding single hole.

* * * * *